(12) United States Patent
Li et al.

(10) Patent No.: US 12,003,352 B2
(45) Date of Patent: Jun. 4, 2024

(54) TECHNIQUES FOR GENERATING A PAM EYE DIAGRAM IN A RECEIVER

(71) Applicant: Intel Corporation, Santa Clara, CA (US)

(72) Inventors: Peng Li, Palo Alto, CA (US); Masashi Shimanouchi, San Jose, CA (US); Hsinho Wu, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 742 days.

(21) Appl. No.: 17/029,445

(22) Filed: Sep. 23, 2020

(65) Prior Publication Data

US 2021/0006439 A1 Jan. 7, 2021

(51) Int. Cl.
*H04L 25/03* (2006.01)
*H03M 1/12* (2006.01)
*H04B 10/54* (2013.01)
*H04B 10/69* (2013.01)
*H04L 27/01* (2006.01)

(52) U.S. Cl.
CPC .... *H04L 25/03031* (2013.01); *H03M 1/1215* (2013.01); *H04B 10/541* (2013.01); *H04B 10/6971* (2013.01); *H04L 25/03267* (2013.01); *H04L 27/01* (2013.01); *H04L 2025/0349* (2013.01)

(58) Field of Classification Search
CPC ......... H04L 25/03031; H04L 25/03267; H04L 27/01; H04L 2025/0349; H04L 25/03057; H04L 25/4917; H03M 1/1215; H04B 10/541; H04B 10/6971

See application file for complete search history.

(56) References Cited

U.S. PATENT DOCUMENTS

| | | | |
|---|---|---|---|
| 8,861,578 B1 | 10/2014 | Lusted et al. | |
| 9,742,689 B1 | 8/2017 | Wang et al. | |
| 10,367,666 B2 | 7/2019 | Zhang et al. | |
| 10,721,106 B1* | 7/2020 | Hormati | H04L 25/03019 |
| 10,785,015 B1* | 9/2020 | Rada | H04L 7/0087 |
| 11,374,801 B2* | 6/2022 | Fox | H04L 25/03057 |
| 2005/0002475 A1* | 1/2005 | Menolfi | H04L 25/497 |
| | | | 375/340 |
| 2018/0375693 A1* | 12/2018 | Zhou | H04L 25/49 |

* cited by examiner

*Primary Examiner* — Jean B Corrielus
(74) *Attorney, Agent, or Firm* — InventIQ Legal LLP

(57) ABSTRACT

A method facilitates determining transmission loss in a transmission signal and adjusting a receiver setting of a receiver to compensate for the transmission loss. The method includes transmitting a transmission signal from a transmitter and receiving the transmission signal by a first receiver and a second receiver. The method includes digitizing the transmission signal by the first receiver at a first sampling frequency and digitizing the transmission signal by the second receiver at a second sampling frequency that is less than or equal to the first sampling frequency. The method includes generating a PAM-n eye diagram of the transmission signal by the second receiver using digitized signals digitized by the first and second receivers and adjusting an equalizer setting of a first equalizer of the first receiver using eye-opening information of the PAM-n eye diagram where the eye-opening information includes information for the transmission loss.

20 Claims, 9 Drawing Sheets

TECHNIQUES FOR GENERATING A PAM EYE DIAGRAM IN A RECEIVER

FIELD OF THE DISCLOSURE

The present disclosure relates to electronic circuitry, and more specifically, to techniques for generating digital information from a transmission for a PAM eye diagram of the transmission using a receiver.

BACKGROUND OF THE INVENTION

Signals transmitted between transmitters and receivers undergo insertion losses and noise that diminish the signal power of the signals as the signals pass from the transmitters to the receivers. Symbols transmitted in a signal exhibit intersymbol interference (ISI) where the edges of the symbols overlap. Insertion loss, noise, and, ISI are due to a number of factors, such as signal reflections, dielectric losses, and copper losses. Transmitters and receivers may both include equalizer circuits that attempt to compensate for insertion loss and noise to reduce ISI. A transmitter may include an equalizer that compensates for insertion losses based on known or predicted insertion losses. A receiver may include an equalizer that compensates for insertion losses based on known or predicted losses, actual insertion losses, one of these losses, or both of these losses. Other transmitters and receivers use back-channel communication to adjust transmitter equalizer for unknown channels that have insertion losses.

As transmission rates are pushed higher, an impetus remains to develop new circuits that compensate for insertions losses and noise of transmitted signals and decrease ISI of the symbols transmitted in the signals.

DETAILED DESCRIPTION

Configurable integrated circuit (IC) dies that are often packaged discretely and as system-in-package (SiP) devices continue to fuel development in IC markets. Circuit emulation markets, application specific integrated circuit (ASIC) prototyping markets, and data center markets are a few of the developing IC markets fueled by configurable IC dies. Configurable IC dies directed toward circuit emulation markets often include several configurable IC dies packaged as a SiP to facilitate an almost unlimited number of emulated circuits where a single configurable IC die may be unable to supply sufficient programmable fabric for implementing an emulation circuit. Configurable IC dies directed toward ASIC prototyping markets often include a number of configurable ICs dies packaged as a SiP to implement a variety of ASICs. Configurable IC dies directed toward data center markets are often discretely packaged or packaged as SiPs to facilitate ASIC functions in the data center, acceleration in the data center, to add processing capability, to add network and virtual network capability, to add non-volatile memory express capability, or other capabilities.

Configurable IC dies directed toward these markets and other markets may include field programmable gate arrays (FPGAs), programmable logic devices (PLDs), complex programmable logic devices (CPLDs), programmable logic arrays (PLAs), configurable logic arrays (CLAs), memory, transfer dies, and other ICs. Configurable IC dies typically include a number of configurable logic blocks that may be configured to implement various circuits. The logic blocks are interconnected by configurable interconnect structures that may be configured to interconnect the logic blocks in almost any desired configuration to provide almost any desired circuit.

In some embodiments disclosed herein, a receiver includes interleaved analog-to-digital converters that generate complementary digital information from a transmission that is complementary to digital information generated by a mission mode analog-to-digital receiver. The number of interleaved analog-to-digital converters of the receiver may be different from the number of elementary analog-to-digital converters of the mission mode analog-to-digital receiver. Additional embodiments are also disclosed herein.

Figure 1:
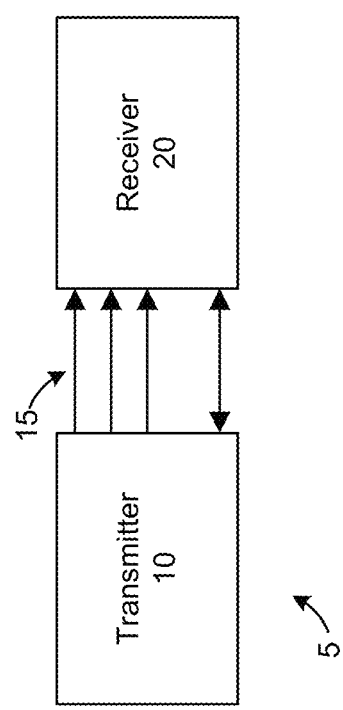
FIG. 1 illustrates a transmission system that includes a transmitter, a communication link, and a receiver where the communication link links the transmitter and the receiver.

FIG. 1 illustrates a transmission system 5 that includes a transmitter 10, a communication link 15, and a receiver 20, where the communication link links the transmitter and the receiver. The transmitter may transmit signals across the communication link to the receiver, which may process the signals so that the signals can be digitized and subsequently used. The communication link may include one or more of a variety of link types, such as copper wires, optical fibers, a wireless link, or a combination of these link types. In an embodiment where the communication link is an optical link (e.g., an optical fiber link), then the transmitter, receiver, or both may include optical ports. In an embodiment where the communication link is a wireless communication link, the transmitter, receiver, or both may include a transmitter antenna, receiver antenna, or both.

The transmitter, communication link, and receiver can be components in a variety of communication environments. For example, the transmitter may be a transmitter in a data center and the receiver may be a receiver in the data center where the communication link is a communication link in the data center. The communication link may be a backbone link in the datacenter. The transmitter, communication link, and receiver may be distributed between network hubs, such as between network hubs in local area networks (LANs), the internet, or other network types. The transmitter can be adapted to transmit signals for a variety of purposes, such as data transmission between servers in a data center, data transmission between a server and a router, data transmission between a router and an end-user computer, or other transmitter and receiver configurations. The transmitter, communication link, and receiver may alternatively be elements in a cellular communication system, such as a 4G or 5G cellular communication system. The transmitter, communication link, and receiver may be elements of an industrial communication system, a military communication system, or both. A transmitted signal that is transmitted by transmitter 10 may have different formats depending on the purpose of the transmission. In an embodiment, the transmitted signal is a pulse amplitude modulation (PAM) signal that includes two PAM levels (PAM-2), three PAM levels (PAM-3), four PAM levels (PAM-4), five PAM levels (PAM-5), six PAM levels (PAM-6), seven PAM levels (PAM-7), eight PAM levels (PAM-8), or more PAM levels (generally PAM-n).

Figure 2:
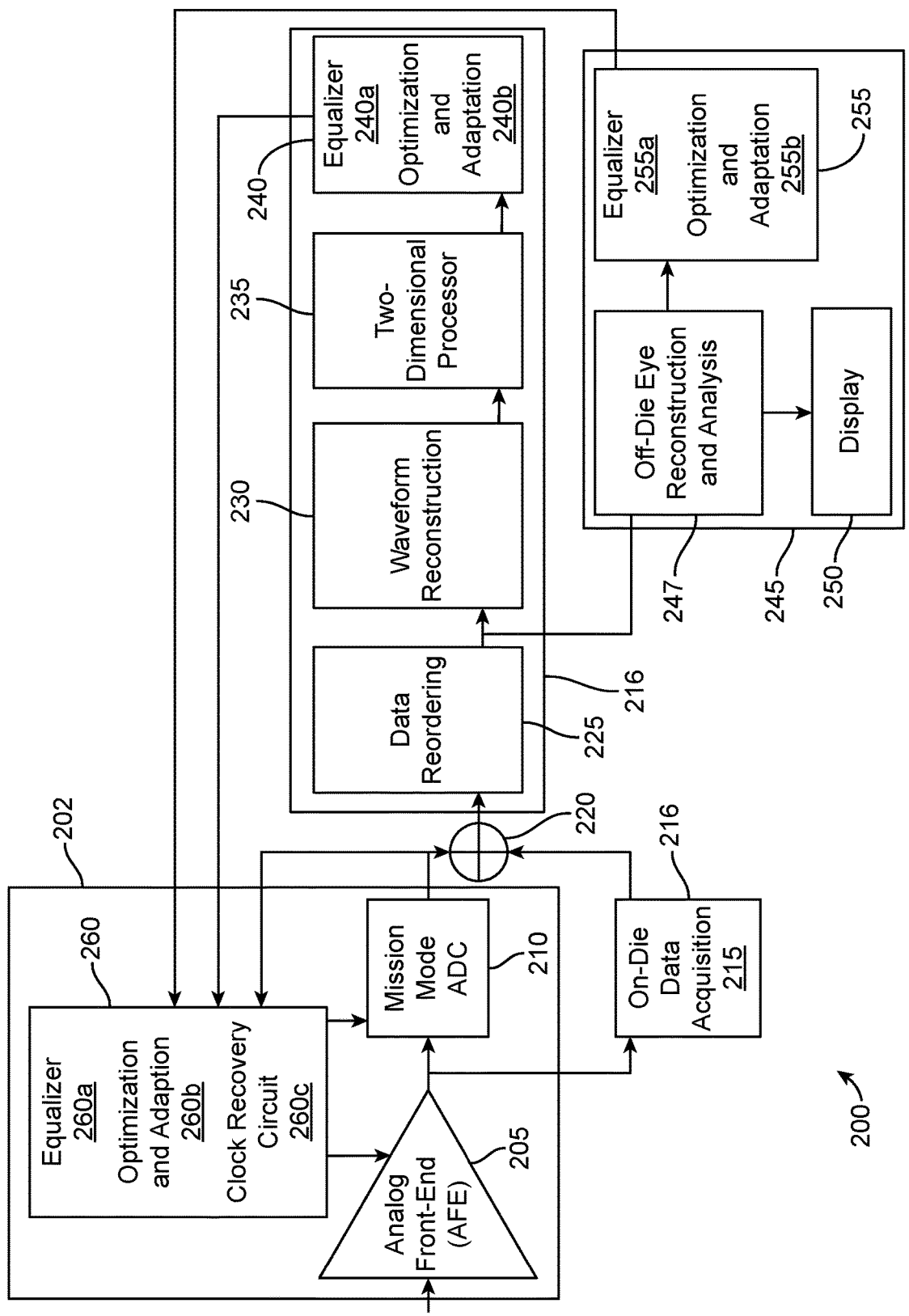
FIG. 2 illustrates a receiver system in an embodiment.

FIG. 2 illustrates a receiver system 200, in an embodiment. Receiver system 200 is adapted to receive a transmission signal, digitize the signal, generate an n-level pulse amplitude modulation (PAM-n) eye diagram for the signal, and adjust one or more equalizers in the system to compensate for transmission losses and noise detected from information from the PAM-n eye diagram.

Receiver 200 includes an analog-to-digital converter (ADC) mission mode receiver 202 and a circuit die 216, in an embodiment. Some embodiments of receiver 200 include an off-die system 245. The mission mode receiver 202 includes an analog front-end circuits 205, a mission mode analog-to-digital converter (ADC) module 210, and a set of circuits 260 that includes an equalizer 260a, optimization and adaption circuit 260b, and a clock recovery circuit 260c. The circuit die 216 may include an on-die data acquisition circuit module 215, a combiner circuit 220, a data reordering circuit 225, a waveform reconstruction circuit 230, a two-dimensional processor 235, a set of circuits 240 that includes an equalizer 240a and optimization and adaptation circuit 240b. Circuit die 216 may include any of the integrated circuit dies described above, such as an FPGA, an ASIC, or another die type. In some embodiments, the mission mode receiver includes combiner circuit 220.

Off-die system 245 may be a computer system or a server system that includes an off-die eye reconstruction and analysis module 247, a display 250, and includes a set of modules 255 that includes an equalizer 255a and an optimization and adaption module 255b. Off-die system 245 may include a number of computer system components, such as one or more processors, one or more memories, one or more user input devices, and other components. The off-die eye reconstruction and analysis module 247, the equalizer 255a, and the optimization and adaption module 255b may be hardware (e.g., circuits), firmware, software modules that include instructions that are stored in the computer system memory, or any combination of hardware, firmware, and software. In one embodiment, receiver 200 does not include off-die system 245.

The analog front-end circuits 205 are adapted to receive the transmission signal and perform analog signal preprocessing on the signal. The transmission signal may be an n-level pulse amplitude modulation (PAM-n) signal (e.g., a PAM-4 signal). The analog front-end circuits may include one or more of a variety of interfaces or circuits, such as a video graphics array (VGA), or more equalizers that perform analog equalization on the received signal, such as a continuous-time linear equalizer (CTLE), other circuits, or any combination of these interfaces or circuits.

Figure 3:
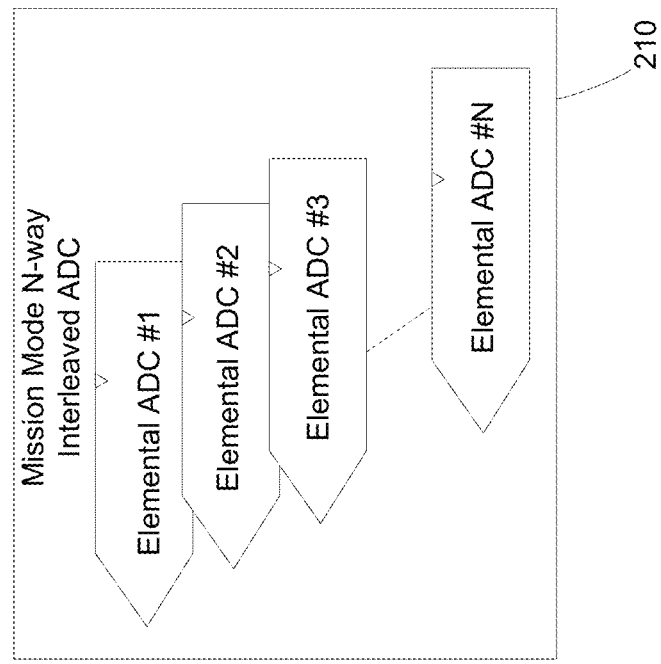
FIG. 3 shows a number N of time-interleaved elemental analog-to-digital converters (ADCs) that may be included in the mission mode ADC.

An input of the mission mode ADC module 210 and an input of the on-die data acquisition circuit module 215 are both connected to an output of the analog front-end circuits 205. The mission mode ADC module and the on-die data acquisition circuit module are adapted to receive an analog signal that is output from the analog front-end circuits. The mission mode ADC module may include a number N of time-interleaved elemental ADCs that digitizes the analog signal received from the analog front-end circuits. FIG. 3 shows a number N of time-interleaved elemental ADCs that may be included in the mission mode ADC. In an embodiment, N is 16, 32, 64, 126, 256, or another number. The mission mode ADC module may include one or more equalizers, such as one or more feed-forward equalizers (FFEs), one or more decision-feedback equalizers (DFEs), a clock recover circuit, other circuits, or an any of these circuits in any combination. The equalizers and clock recovery circuit may be digital circuits that operate on the digital output of the elemental ADCs. The mission mode ADC module may include one or more other types of equalizers, such as a linear equalizer (which processes a transmission signal with a linear filter), a zero forcing equalizer (which approximates the inverse of the channel with a linear filter by augmenting a linear equalizer by adding a filtered version of previous symbol estimates to the original filter output filter), a blind equalizer (which estimates that the transmitted signal without knowledge of the channel statistics and uses only knowledge of the transmitted signal's statistics) an adaptive equalizer (which is typically a linear equalizer or a DFE, which updates the equalizer parameters (such as the filter coefficients) as it is processes the data and can use the a cost functions and it assumes that it makes the correct symbol decisions and uses its estimate of the symbols to compute e which is defined above), a Viterbi equalizer (which finds the optimal solution to the equalization problem to minimize the probability of making an error over the entire sequence), a BCJR (Bahl-Cocke-Jelinek-Raviv algorithm) equalizer (which uses the BCJR algorithm to minimize the probability that a given bit was incorrectly estimated, a turbo equalizer (which applies turbo decoding while treating the channel as a convolutional code), or one or more other types of equalizers.

Figure 4:
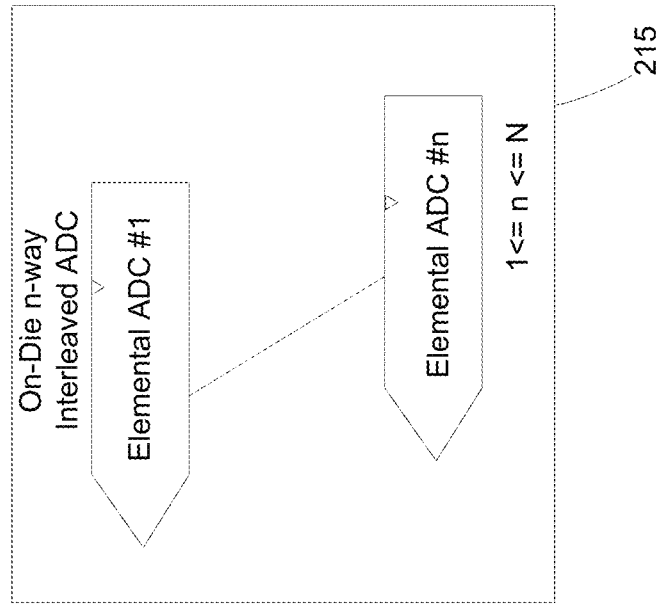
FIG. 4 shows a number n of time-interleaved elemental ADCs that may be included in the on-die acquisition circuit.

The on-die data acquisition circuit module 215 may include a number n of time-interleaved elemental ADCs. The number n is greater than or equal to one and less than or equal to N (i.e., 1<=n<=N). In an embodiment, n is 1, 2, 3, 4, 5, 6, 7, 8, 9, 10, or greater. FIG. 4 shows a number n of time-interleaved elemental ADCs that may be included in the on-die acquisition circuit. The time-interleaved elemental ADCs may receive the analog signal from the analog front-end circuits. In an embodiment, the on-die data acquisition circuit module 215 may be configured in circuit die 216. Circuit die 216 may be an ASIC, a CPU (central processing unit), a GPU (graphics processing unit), the core fabric of a circuit die, such as an FPGA, or another circuit. The mission mode ADC module may be on a different die from the on-die data acquisition circuit module.

The outputs of both the mission mode ADC module and the on-die data acquisition circuit module are connected to an input of the combiner circuit 220, which may include a memory. The combiner circuit may store the digitized signals that are output from the mission mode ADC module and the on-die data acquisition circuit module. The digital signals output from both the mission mode ADC module and the on-die data acquisition circuit module that are combined by the combiner may be transmitted to the data reordering circuit 225, which performs reordering of the digital signals that are output (i.e., sampled output) from the mission mode ADC module and the on-die data acquisition circuit module.

The output of the data reordering circuit 225 may be connected to the input of the waveform reconstruction circuit 230. The waveform reconstruction circuit may perform one or more digital signal processing (DSP) operations on the data-reordered digital signals that are received from the data reordering circuit. DSP operations performed by the waveform reconstruction circuit may include digital equalization operations (such as FFE or DFE), static emulation, other processing, or any combination of these processes. In an implementation, the tap coefficients of the FFE, DFE, or both may be the same as the tap coefficients of the FFE, DFE, or both, respectively, of the mission mode ADC module. The output of the waveform reconstruction circuit 230 is a sampled waveform form of the sampled data that is reordered by the data reordering circuit.

The equalizers in waveform reconstruction circuit 230 may have a variety of orders. For example, the FFE may be before the DFE. That is the output of the FFE is connected to an input of the DFE where a transmission signal may be transmitted into an input of the FFE and filtered and then transmitted from the FFE to the DFE for subsequent filtering. Alternatively, the DFE may be before the FFE. That is the output of the DFE is connected to an input of the FFE where a transmission signal may be transmitted into an input of the DFE and filtered and then transmitted from the DFE to the FFE for subsequent filtering.

The output of the waveform reconstruction circuit 230 may be connected to the input of the two-dimensional processing circuit 235. The two-dimensional processing circuit may receive the digitally processed signals from the waveform reconstruction circuit. The two-dimensional processing circuit may perform eye-diagram construction on the received digital signal.

The output of the two-dimension processing circuit 235 is connected to the input of the equalizer 240a, the optimization and adaptation circuit 240b (e.g., an analysis circuit that analyses the eye openings of the PAM-n eye diagram), or both. In an implementation, an output of equalizer 240a is connected to an input of the optimization and adaptation circuit 240b.

In an embodiment, the equalizer performs equalization (FFE, DFE, or both) on the signals for the PAM-n eye diagram. If equalization is not performed, or after equalization is performed, the optimization and adaptation circuit 240 extracts information from the PAM-n eye diagram, such as eye-opening height, eye-opening width, timing information for the eye-openings, other information, or any combination of this information. This information for the PAM-n eye diagram relates to a measure of link performance or margin of the link. That is, information for the PAM-n eye diagram relates to the losses and noise in the transmission signal that are related to insertion loss, transmission loss, and noise, such as noise and jitter.

In an embodiment, the data reordering circuit 225, the waveform reconstruction circuit 230, the two-dimensional processing circuit 235, and the set of circuits 240 are configured in circuit die 216 where the on-die data acquisition circuit module 215 is configured. For example, the data reordering circuit, waveform reconstruction circuit, the two-dimensional processing circuit, circuits 240, and the on-die data acquisition circuit module may be configured in the core fabric of an FPGA. In an embodiment, the circuit die (e.g. the FPGA) that the described circuits are configured in is mounted a circuit board, such as a peripheral component interconnect express (PCIe) card. The PCIe card may be coupled to a computer system, such as a computer system in a data center. The computer system may be a distributed computer system distributed across one or more racks in the data center. The computer system may be adapted to communicate with other computer systems in the data center via one or more wired or wireless protocols (e.g., Ethernet protocol).

In an embodiment, the output of the optimization and adaptation circuit 240 is connected to the input of the equalizer 260a, the optimization and adaption system 260b, the clock recovery circuit 260c, any one of these circuits, or any combination of these circuits. The equalizer may perform FFE, DFE, other equalization operations, or any combination of these equalization optimizations.

The information for the transmission signal that is determined from the PAM-n eye diagram may be transmitted from the adaptation circuit to equalizer 260a where the information is used by the equalizer or another circuit coupled to the equalizer to adjust one or more settings of the equalizer. Specifically, the information may be used to adjust the equalization (i.e., signal conditioning) performed of the equalization. In one embodiment, the information is used to adjust one or more tap coefficients of the equalizer. Adjusting the equalization performed by the equalizer using the information of the PAM-n eye diagram allows for the equalizer to compensate for the losses (e.g., insertions losses, transmission losses, noise, or other losses) in the transmission signal. In an embodiment, the information generated by circuits 260 or received by circuits 260 may be transmitted from circuit 260 to analog front-end circuits 205. The information transmitted may be used to adjust one or more settings of the analog front-end circuits 205, such as adjusting one or more settings of the CTLE (e.g., adjust one or more tap settings) or the VGA.

In an embodiment, an output of the mission mode ADC module 210 is connected to an input of the equalizer 260a, the optimization and adaption system 260b, the clock recovery circuit 260c, any one of these circuits, or any combination of these circuits. In addition, an output from the clock recovery circuit 260c may be connected to an input of the mission mode ADC. For example, a recovered clock signal may be transmitted from the clock recovery circuit to the mission mode ADC, and the clock signal or other signal may be fed back into the clock recovery circuit.

In an embodiment, the output of the data reordering circuit 225 is connected to an input-output port of off-die computer system 245. The data reordering circuit may be connected to the input-output port via an Ethernet connection or other connection. The digitized transmission signal output from the data reordering circuit may be transmitted to the off-die computer system. The off-die computing system may provide more computing power than the circuit die that includes the data reordering circuit 225, the waveform reconstruction circuit 230, the two-dimensional processing circuit 235, the set of circuits 240, and the on-die data acquisition circuit 215.

In an embodiment, the off-die eye reconstruction and analysis system 247 may receive the digitized transmission signal and generate a PAM-n eye diagram from the signal. Equalizer 255a may be adapted to equalize the digitized transmission signal in an embodiment. Equalizer 225a may include an FFE, a DFE, or another equalizer that equalizes the digitized transmission signal. The digitized transmission signal may be equalized prior to the generation of the PAM-n eye diagram by the off-die eye reconstruction and analysis system 247. Similar to optimization and adaption circuit 240*b*, the optimization and adaptation module 255*b* extracts information from the PAM-n eye diagram, such as eye-opening height, eye-opening width, timing information for the eye-openings, other information, or any combination of this information. This information for the PAM-n eye diagram relates to a measure of link performance or margin of the link. That is, information for the PAM-n eye diagram relates to noise, transmission loss, and insertion loss.

The information for the transmission signal that is determined by the optimization and adaption module 255*b* from the PAM-n eye diagram may be transmitted from the adaptation module to equalizer 260*a* where the information is used by the equalizer or another circuit coupled to the equalizer to adjust one or more settings of the equalizer. Specifically, the information may be used to adjust the equalization (i.e., signal conditioning) performed of the equalization. In one embodiment, the information is used to adjust one or more tap coefficients of the equalizer. Adjusting the equalization performed by the equalizer using the information of the PAM-n eye diagram allows for the equalizer to compensate for the losses (e.g., insertions losses, transmission losses, or other losses) in the transmission signal.

Figure 5:
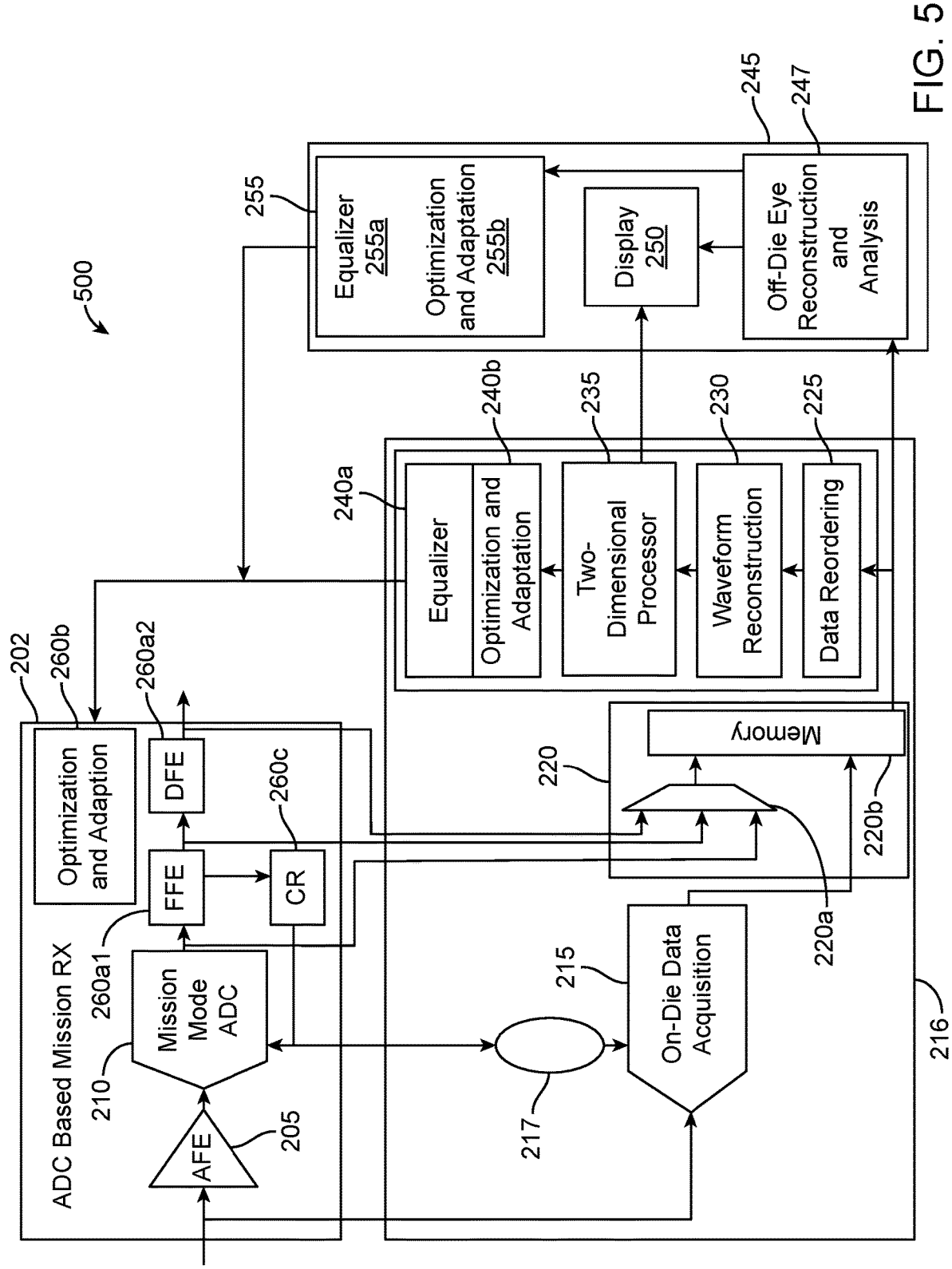
FIG. 5 shows a receiver system, in an embodiment.

FIG. 5 shows a receiver system 500, in an embodiment. Receiver system 500 is similar to receiver system 200. FIG. 5 shows a specific configuration of the circuits of combiner circuit 220 and circuits 260 of receiver system 500.

In an embodiment, the set of circuits 260 includes an FFE 260*a*1 and a DFE 260*a*2. An input of the FFE is connected to an output of the mission mode ADC module 210 and an output of the FFE is connected to an input of the DFE and to an input of the clock recover circuit 260*c*. An output of the DFE is the output of the ADC based mission mode receiver 202. In an alternative embodiment, the order of the FFE and DFE are switched. That is, an input of the DFE is connected to an output of the mission mode ADC module 210 and an output of the DFE is connected to an input of the FFE. An output of the FFE is the output of the ADC based mission mode receiver 202. The order of the FFE and DFE may be programmable, such as being programmable in the core fabric of an FPGA in which circuit 260 may be configured or in an ASIC in which the equalizers are formed.

An output of the clock recovery circuit is connected to a clock input of the mission mode ADC module 210 and to an input of the circuit die 216. More specifically, the output of the clock recover signal that is connected to the input of the circuit die is connected to a programmable delay circuit 217. An output of the programmable delay circuit 217 is connected to the clock input of the on-die data acquisition circuit module 215.

The combiner circuit 220 includes a multiplexer 220*a* and a memory 220*b*, in an embodiment. Multiplexer 220*a* includes a first input connected to the output of the DFE, a second input connected to the output of the FFE, and a third input connected to an output of the on-die data acquisition circuit module 215. An output of the multiplexer is connected to an input of the memory 220*b*. The inputs to the multiplexer may be different or may be programmable, for example, based on the order of the FFE and the DFE in ADC based mission receiver 202.

In one embodiment, the FFE is adapted to receive the digitized transmission signal from the mission mode ADC module 210 and feed-forward equalize the received transmission signal. The equalized transmission signal is then transmitted from the FFE to the DFE, which is adapted to perform a decision feedback equalization on the received equalized transmission signal. In an alternative embodiment, the DFE is adapted to receive the digitized transmission signal from the mission mode ADC module 210 and perform a decision feedback equalization on the received transmission signal. The equalized transmission signal is then transmitted from the DFE to the FFE, which is adapted to perform a feed-forward equalization on the received equalized transmission signal.

The clock recovery circuit is adapted to receive the equalized transmission signal from the FFE or the DFE and recover a clock signal from the equalized transmission signal. The clock recovery circuit may receive the equalized transmission signal from the FFE or the DFE if the FFE is positioned before the DFE (i.e., FFE is between the time interleaved N element ADCs and the DFE) or if the DFE is positioned before the FFE (i.e., DFE is between the time interleaved N element ADCs and the FFE). The clock recovery circuit is adapted to transmit the clock signal to the mission mode ADC module 210 and the programmable delay circuit 217.

The programmable delay circuit 217 is adapted to adjust the phase of the clock signal and transfer the phase adjusted clock signal to the on-die data acquisition circuit module 215. In an implementation, the transmission signal digitized by the on-die data acquisition circuit module is stored in the memory. The operation of other portions of the system is described above with respect to FIG. 2.

Figure 6:
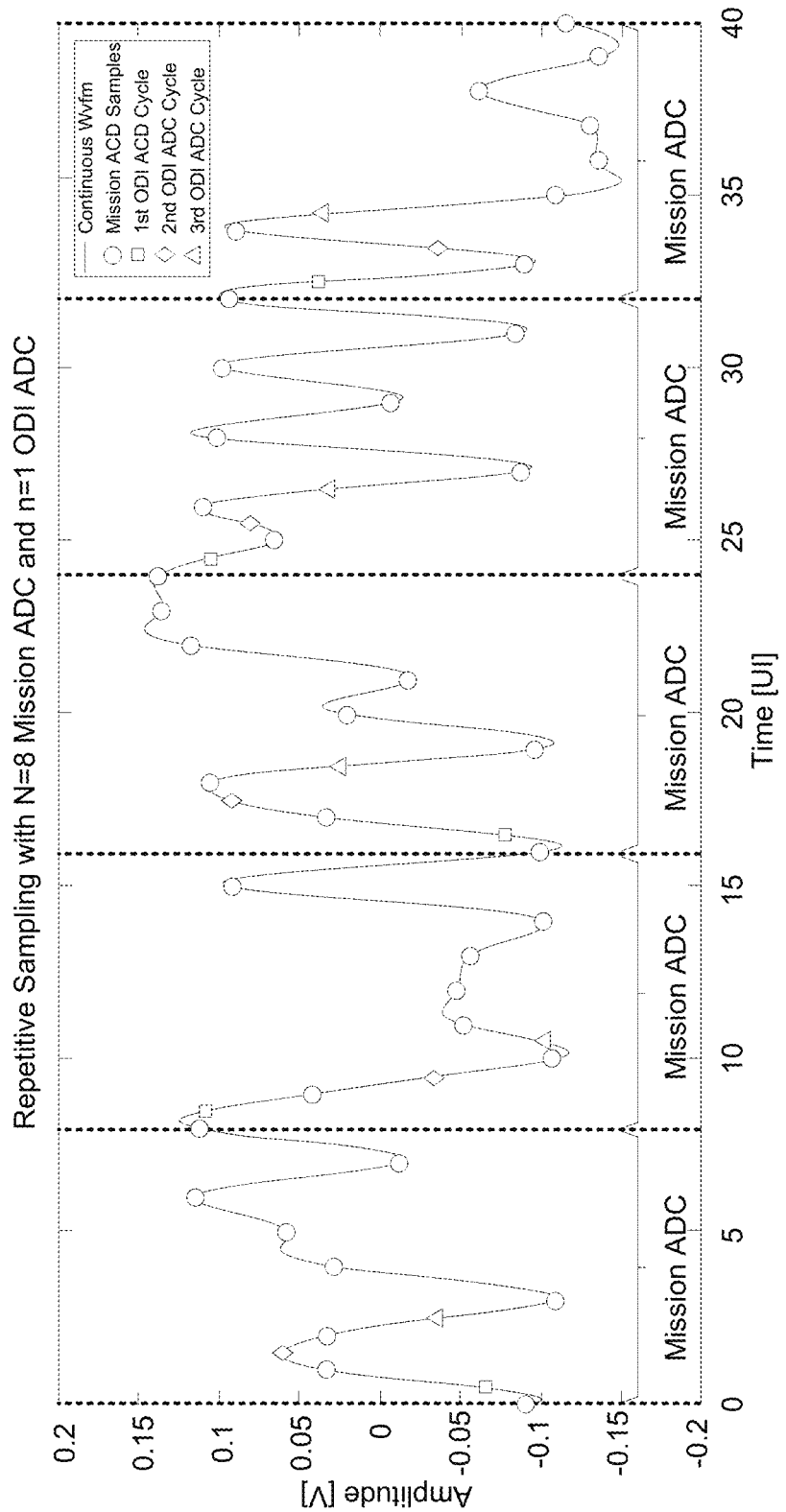
FIG. 6 is a graph of the digitized samples of the transmission signal generated by the ADC based mission mode receiver and the on-die data acquisition circuit module.

FIG. 6 is a graph of the digitized samples of the transmission signal generated by the ADC based mission mode receiver 202 and the on-die data acquisition circuit module 215. ODI in FIG. 6 refers to on-die instrument. The digitized samples on the graph marked with the circular markers are the digitized samples generated by the mission mode ADC module 210. The square-shaped markers, the diamond-shaped markers, and the rectangular-shaped markers are digitized samples generated by the on-die data acquisition circuit module 215. The smooth curve represents the continuous transmission signal as the reference. In an embodiment, the continuous transmission signal is a test signal that is repeatedly transmitted from the transmitter 10 to the receiver 202. The test signal is the same signal that is repeatedly transmitted.

In an embodiment, the ADC based mission mode receiver 202 samples the transmission signal a number of times in a unit of time (i.e., unit interval, UI). The UI in the example embodiment is an arbitrary unit of time. The number of samples digitized in the UI may be one sample as shown in FIG. 6 or may be more samples, such as two samples, three samples, four samples, five samples, six samples, seven samples, eight samples, nine samples, ten samples, or a greater number of samples.

In a given cycle, the ADC based mission mode receiver 202 generates eight consecutive digitized samples (eight consecutive circular markers on the graph) over an eight UI long time duration. That is, a cycle includes eight UI and is indicated by the vertical lines (e.g., dashed lines) in FIG. 6. A total of five cycles are shown in FIG. 6. The digitization process repeats for consecutive cycles.

A first time that the transmission signal is transmitted from the transmitter to the ADC based mission mode receiver 202 and received by the on-die data acquisition circuit module 215, in a given number of cycles (e.g., eight cycles), the on-die data acquisition circuit module 215 may acquire one digitized sample (e.g., square-shaped markers) between the first and the second "mission mode" samples digitized by the ADC based mission mode receiver 202.

A second time that the transmission signal is transmitted from the transmitter to the ADC based mission mode receiver 202 and received by the on-die data acquisition circuit module 215, in a given number of cycles (e.g., eight cycles), the on-die data acquisition circuit module 215 may acquire one digitized sample (e.g., diamond-shaped markers) between the second and the third mission mode samples.

A third time that the transmission signal is transmitted from the transmitter to the ADC based mission mode receiver 202 and received by the on-die data acquisition circuit module 215, in a given number of cycles (e.g., eight cycles), the on-die data acquisition circuit module 215 may acquire one digitized sample (e.g., triangular-shaped markers) between the third and the fourth mission mode samples.

The transmission signal can be transmitted a number of additional times (e.g., 4, 5, 6, 7, 8, 9, 10, or more times) where the on-die data acquisition circuit module 215 can generate additional digitized data between other digitized samples digitized by the ADC based mission mode receiver 202. In a particular embodiment, the transmission signal is transmitted eight times from the transmitter 10 to the ADC based mission mode receiver 202. When the transmission signal is transmitted for an eighth time, the on-die data acquisition circuit module 215 may sample the transmission signal more than once per UI, such as twice per UI.

In one embodiment, one or both of the ADC based mission mode receiver 202 and the on-die data acquisition circuit module 215 are adapted to operate an interpolation algorithm that provides for statistical analysis of the digitized signals for the repeated transmission of the transmission signal. The interpolation algorithm allows for smoothing data for the digitized signal. Such statistical analysis is provided for because of the repeated transmission of the transmission signal from the transmitter to the ADC based mission mode receiver 202.

Figure 7:
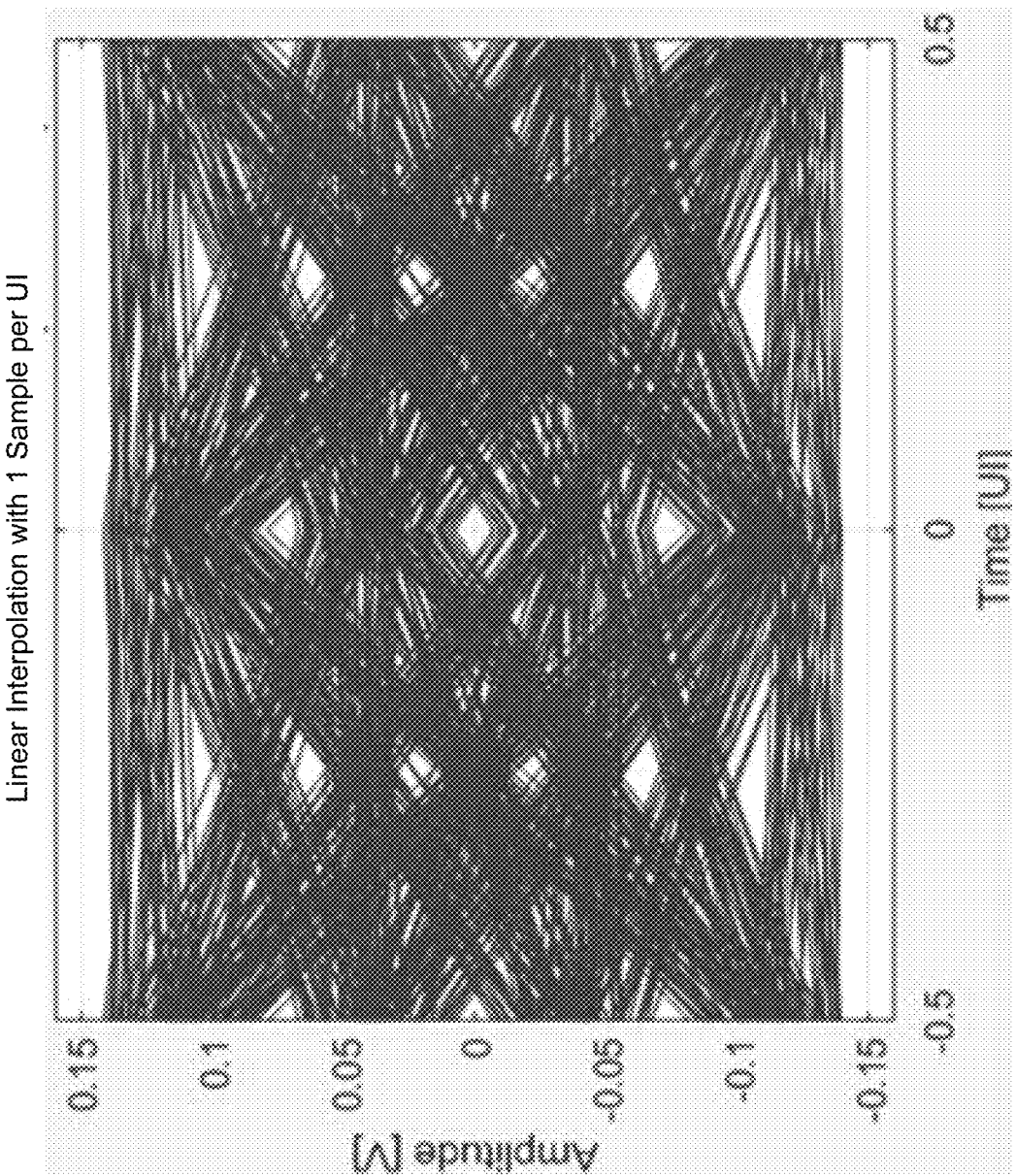
FIG. 7 is an example PAM-4 eye diagram that may be generated by the ADC based mission mode receiver, the circuits on circuit die, by the off-die system, or any combination of these circuits.

FIG. 7 is an example PAM-4 eye diagram that may be generated by the ADC based mission mode receiver 202, the circuits on circuit die 216, by the off-die system 245, or any combination of these circuits. The PAM-4 eye diagram may be generated by linear interpolation of the digitized data generated by the ADC based mission mode receiver 202 and the circuits configured or formed on circuit die 216 (e.g., circuits 215, 225, 230, 235, and 240) where the circuits of circuit die 216 generate one digitized data point per UI to supplement the digitized data points generated by the ADC based mission mode receiver 202. Alternatively, the PAM-4 eye diagram may be generated by linear interpolation of the digitized data generated by the ADC based mission mode receiver 202 and the off-die system 245, where the off-die system 245 generates one digitized data point per UI.

Figure 8:
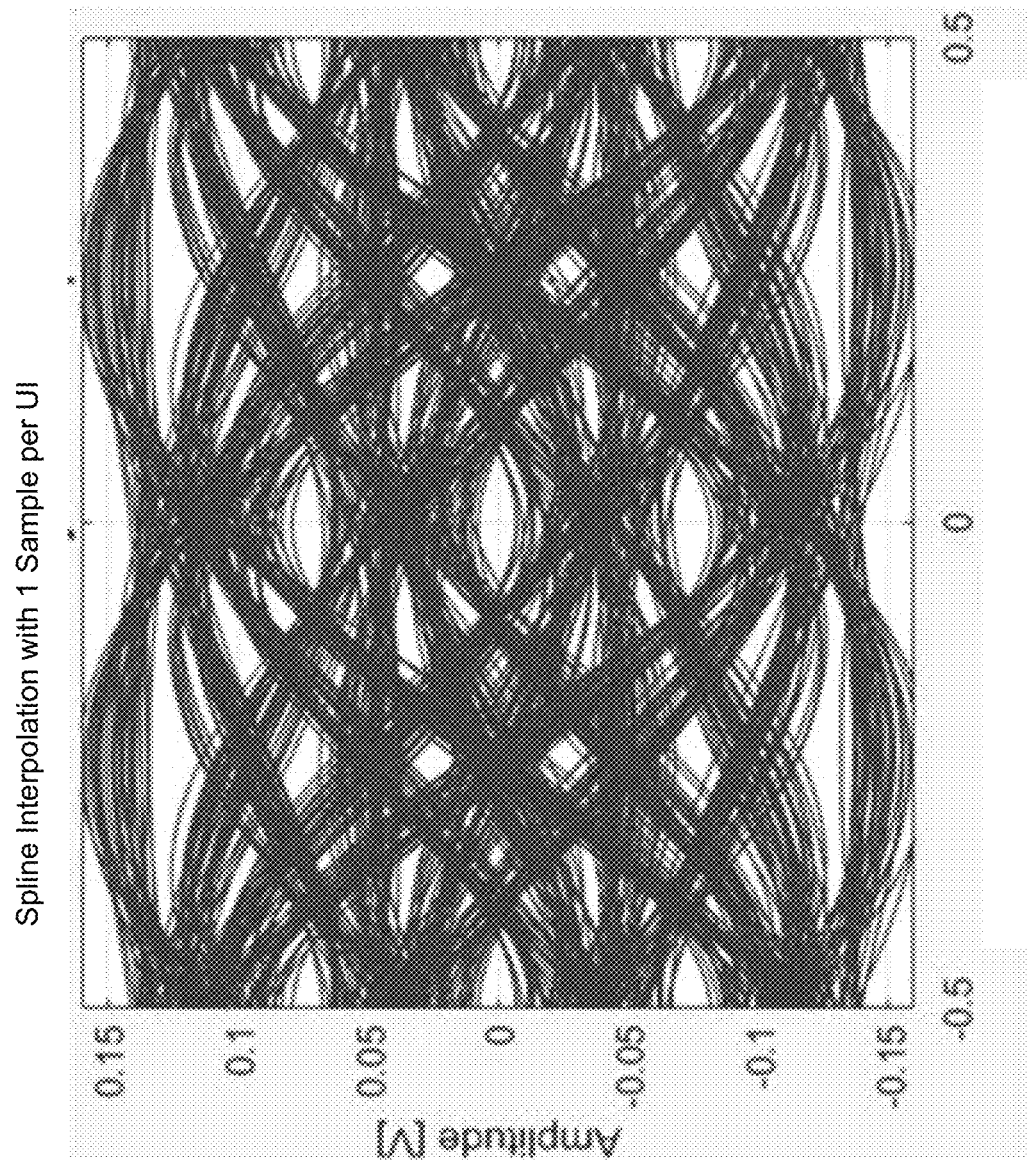
FIG. 8 is an example PAM-4 eye diagram that may be generated by the ADC based mission mode receiver, the circuits on circuit die, by the off-die system, or any combination of these circuits.

FIG. 8 is an example PAM-4 eye diagram that may be generated by the ADC based mission mode receiver 202, the circuits on circuit die 216, by the off-die system 245, or any combination of these circuits. The PAM-4 eye diagram may be generated by spline interpolation of the digitized data generated by the ADC based mission mode receiver 202 and the circuits configured or formed on circuit die 216 (e.g., circuits 215, 225, 230, 235, and 240) where the circuits of circuit die 216 generate one digitized data point per UI to supplement the digitized data points generated by the ADC based mission mode receiver 202. Alternatively, the PAM-4 eye diagram may be generated by spline interpolation of the digitized data generated by the ADC based mission mode receiver 202 and the off-die system 245, where the off-die system 245 generates one digitized data point per UI. Spline interpolation is a form of interpolation where the interpolant is a special type of piecewise polynomial called a spline. Using spline interpolation, the interpolation error can be made relatively small even when using low degree polynomials for the spline.

Figure 9:
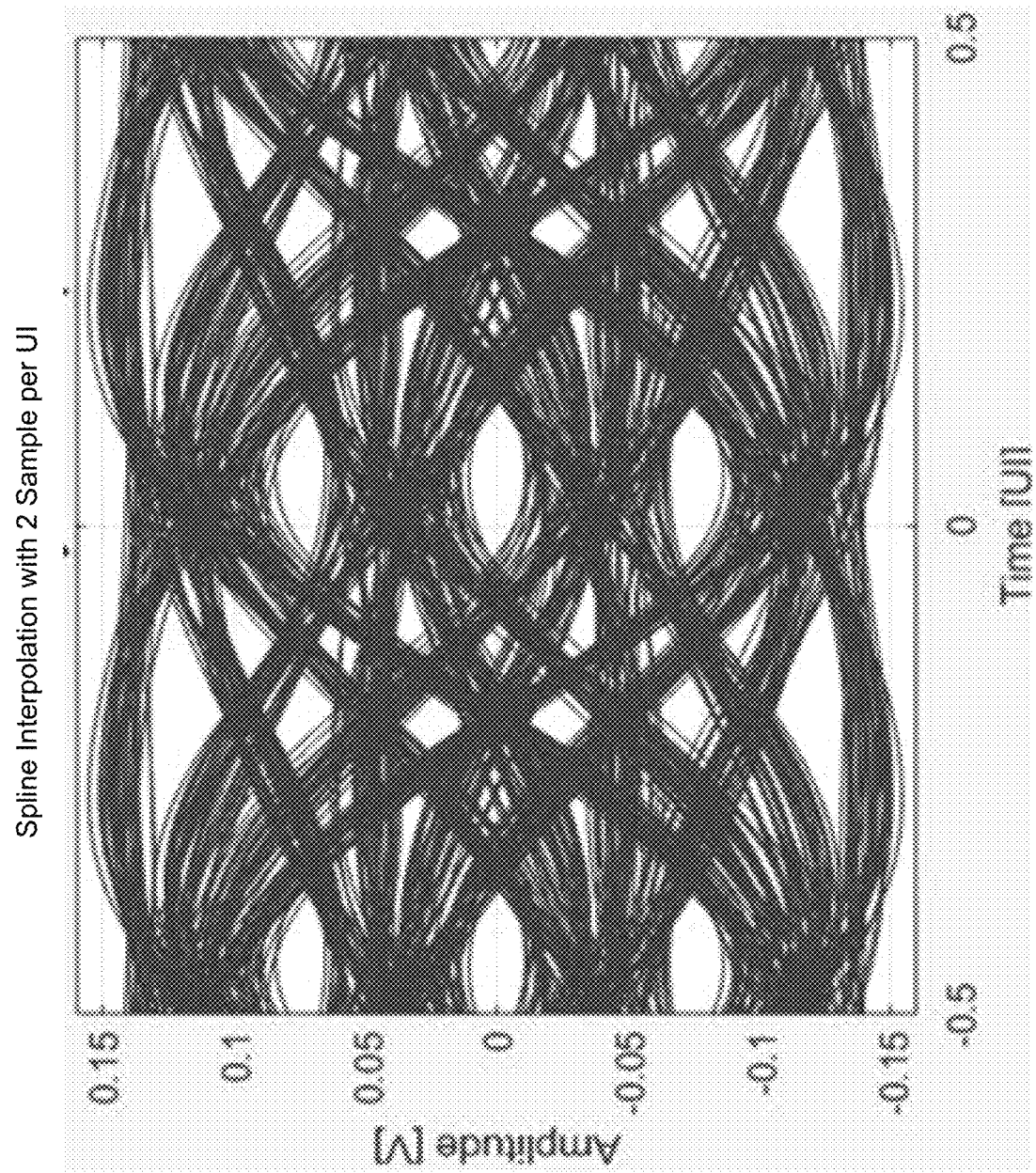
FIG. 9 is an example PAM-4 eye diagram that may be generated by the ADC based mission mode receiver, the circuits on circuit die, by the off-die system, or any combination of these circuits.

FIG. 9 is an example PAM-4 eye diagram that may be generated by the ADC based mission mode receiver 202, the circuits on circuit die 216, by the off-die system 245, or any combination of these circuits. The PAM-4 eye diagram may be generated by spline interpolation of the digitized data generated by the ADC based mission mode receiver 202 and the circuits configured or formed on circuit die 216 (e.g., circuits 215, 225, 230, 235, and 240) where the circuits of circuit die 216 generate two digitized data points per UI to supplement the digitized data points generated by the ADC based mission mode receiver 202. Alternatively, the PAM-4 eye diagram may be generated by spline interpolation of the digitized data generated by the ADC based mission mode receiver 202 and the off-die system 245, where the off-die system 245 generates two digitized data point per UI.

Information from one or more of the PAM-4 eye diagrams may be used for clock recovery by the clock recovery circuit and may be used for optimization and adaptation of the equalizers by setting the taps of the equalizers (e.g., FFE, DFE, CTLE, VGA, other circuits, or any combination of these circuits) to compensate for transmission losses in the transmitted signal (e.g., transmitted test signal).

Figure 10:
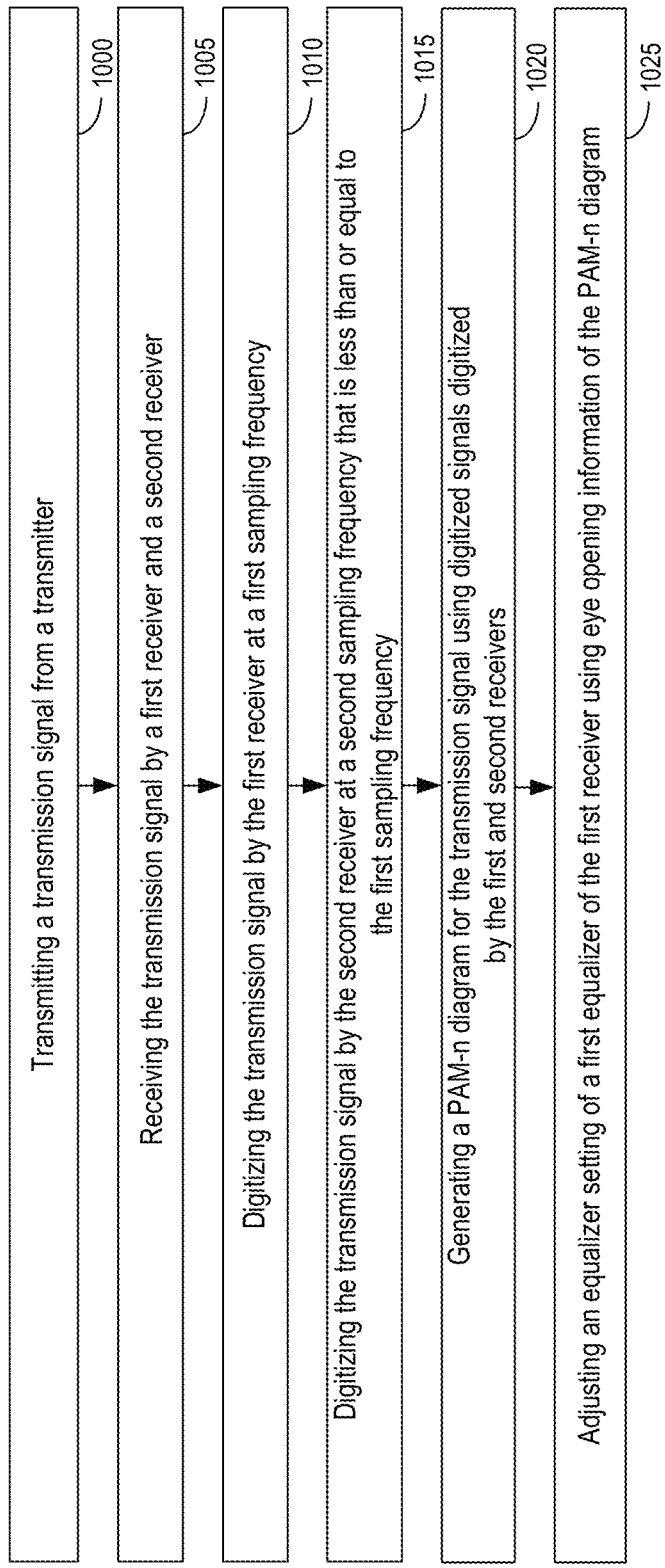
FIG. 10 is a flow diagram for a method of adjusting an equalizer of a receiver where the adjustment compensates for transmission losses of a transmission signal from a transmitter to a receiver.

FIG. 10 is a flow diagram for a method of adjusting an equalizer of a receiver where the adjustment compensates for transmission losses of a transmission signal from a transmitter to a receiver. The flow diagram is for an example embodiment. Steps may be added to the flow diagram, removed from the flow diagram, or combined without deviating from the method.

At 1000, a transmission signal is transmitted from a transmitter. The transmitter and transmission signal may be any of the transmitter and transmission signal embodiments described above.

At 1005, the transmission signal is received by a first receiver and a second receiver. The first receiver may be the ADC based mission mode receiver 202. The second receiver may be circuit die 216 or may be one or more of the circuits of circuit die 216, such as the on-die data acquisition circuit module 215.

At 1010, the transmission signal is digitized by the first receiver using a first sampling frequency. At 1015, the transmission signal is digitized by the second receiver at a second sampling frequency that is less than or equal to the first sampling frequency (e.g., if n is less than or equal to N). In an embodiment, the transmission signal is digitized by the second receiver at a second sampling frequency that is less than the first sampling frequency (e.g., if n is less than N). In an embodiment, the transmission signal is digitized by the second receiver at a second sampling frequency that is equal to the first sampling frequency (e.g., if n is less than or equal to N).

At 1020, a PAM-n eye diagram is generated using digitized signals digitized by the first and second receivers from the transmission signal. For example, the PAM-n eye diagram may be generated by the second receiver.

At 1025, an equalizer setting of a first equalizer of the first receiver is adjusted using eye-opening information of the PAM-n eye diagram. The eye-opening information includes information for the transmission losses of the transmission signal between the transmitter and the first and second receivers. The adjustment of the equalizer allows the equalizer to compensate for the transmission losses when receiving subsequent transmission signals from the transmitter.

EXAMPLES

The following examples pertain to further embodiments.

Example 1 is a method comprising: transmitting a transmission signal from a transmitter; receiving the transmission signal by a first receiver and a second receiver; digitizing the transmission signal by the first receiver at a first sampling frequency; digitizing the transmission signal by the second receiver at a second sampling frequency that is less than the first sampling frequency; generating a pulse amplitude modulation (PAM) eye diagram for a plurality of transmission amplitudes of the transmission signal by the second receiver using digitized signals of the transmission signal digitized by the first and second receivers, and adjusting an equalizer setting of a first equalizer of the first receiver using eye-opening information of the PAM eye diagram.

Example 2 is a method of example 1, further comprising adjusting an equalizer setting of a second equalizer of the first receiver using the eye-opening information of the PAM eye diagram.

Example 3 is a method of example 2, wherein the first equalizer is a feed-forward equalizer (FFE) and the second equalizer is a decision-feedback equalizer (DFE).

Example 4 is a method of example 3, wherein the FFE and DFE are in series.

Example 5 is a method of example 1, wherein digitizing the transmission signal by the first receiver comprises digitizing the transmission signal by a first number of interleaved analog-to-digital converters of the first receiver, digitizing the transmission signal by the second receiver comprises digitizing the transmission signal by a second number of interleaved analog-to-digital converters of the second receiver, and the first number of interleaved analog-to-digital converters is greater than the second number of interleaved analog-to-digital converters.

Example 6 is a method of example 5, wherein the first number of interleaved analog-to-digital converters is greater than or equal to the second number of interleaved analog-to-digital converters.

Example 7 is a method of example 5, wherein the first number of interleaved analog-to-digital converters is sixteen times greater than the second number of interleaved analog-to-digital converters.

Example 8 is a method of example 5, wherein the first number of interleaved analog-to-digital converters is thirty-two times greater than the second number of interleaved analog-to-digital converters.

Example 9 is a method of example 5, wherein the second number of interleaved analog-to-digital converters is one.

Example 10 is a circuit comprising: a first receiver circuit comprising a first number of interleaved analog-to-digital converters; a data reordering circuit coupled to the first number of interleaved analog-to-digital converters; a first equalizer coupled to the data reordering circuit; a pulse amplitude modulation (PAM) eye diagram construction circuit coupled to the first equalizer circuit; and an analysis circuit coupled to the PAM eye diagram construction circuit, wherein the analysis circuit is coupled to receive a pulse amplitude modulation (PAM) eye diagram and transmit eye information of the PAM eye diagram to a second receiver circuit to adjust a setting of a second equalizer of the second receiver circuit.

Example 11 is a circuit of example 10, wherein the setting of the second equalizer is a tap setting.

Example 12 is a circuit of example 10, further comprising a configurable circuit die comprising a configurable core fabric, wherein the configurable core fabric comprises the first receiver circuit, data reordering circuit, the first equalizer, the PAM eye diagram construction circuit, and the analysis circuit.

Example 13 is a circuit of example 10, wherein the second receiver is not on the configurable circuit die.

Example 14 is a circuit of example 13, wherein the second receiver circuit comprises a second number of analog-to-digital converters, and the second number of analog-to-digital converters is greater than or equal to the first number of analog-to-digital converters.

Example 15 is a circuit of example 10, further comprising a second equalizer coupled to the analysis circuit to perform equalization on the eye information prior to transmission of the eye information to the second receiver circuit.

Example 16 is a circuit of example 10, wherein the first equalizer comprises at least one of a feed-forward equalizer and a decision-feedback equalizer.

Example 17 is a circuit of example 10, wherein the second receiver is a mission mode receiver.

Example 18 is a circuit of example 10, further comprising a memory coupled between the first number of interleaved analog-to-digital converters and the data reordering circuit to store digitized samples of a transmission signal received by the first number of interleaved analog-to-digital converters.

Example 19 is a method comprising: consecutively transmitting a transmission signal from a transmitter a plurality of times; receiving each of the transmission signals by a first receiver and a second receiver; consecutively digitizing each of the transmission signals by the first receiver at a first sampling frequency; consecutively digitizing each of the transmission signals by the second receiver at a second sampling frequency that is less than or equal to the first sampling frequency; generating a pulse amplitude modulation (PAM) eye diagram of the transmission signals using digitized signals digitized by the first and second receivers from the transmission signals; determining eye-opening information of at least one eye of the PAM eye diagram; and adjusting a tap setting of a first equalizer of the first receiver using the eye-opening information determined from the eye of the PAM eye diagram to compensate for transmission losses and noise of the transmission signals from the transmitter to the first and second receivers.

Example 20 is a method of example 19, further comprising adjusting a tap setting of a second equalizer of the first receiver using the eye-opening information of the eye of the PAM eye diagram, wherein the eye-opening information includes information for transmission loss of the transmission signals.

This description has been presented for the purposes of illustration and description. It is not intended to be exhaustive or to limit the invention to the precise form described, and many modifications and variations are possible in light of the teaching above. The embodiments were chosen and described in order to best explain the principles of the embodiments and their practical applications. This description will enable others skilled in the art to best utilize and practice the invention in various embodiments and with various modifications as are suited to a particular use. The scope of the invention is defined by the following claims.

What is claimed is:
1. A method comprising:
transmitting a transmission signal from a transmitter;

receiving the transmission signal by a first receiver and a second receiver;

digitizing the transmission signal by the first receiver at a first sampling frequency;

digitizing the transmission signal by the second receiver at a second sampling frequency that is less than or equal to the first sampling frequency;

generating a pulse amplitude modulation (PAM) eye diagram for a plurality of transmission amplitudes of the transmission signal by the second receiver using digitized signals of the transmission signal digitized by the first and the second receivers; and adjusting a first equalizer setting of a first equalizer of the first receiver using eye-opening information of the PAM eye diagram to compensate for transmission loss of the transmission signal.

2. The method of claim 1, further comprising adjusting a second equalizer setting of a second equalizer of the first receiver using the eye-opening information of the PAM eye diagram.

3. The method of claim 2, wherein the first equalizer is a feed-forward equalizer (FFE) and the second equalizer is a decision-feedback equalizer (DFE).

4. The method of claim 3, wherein the FFE and DFE are in series.

5. The method of claim 1, wherein digitizing the transmission signal by the first receiver comprises digitizing the transmission signal by a first number of first interleaved analog-to-digital converters of the first receiver, wherein digitizing the transmission signal by the second receiver comprises digitizing the transmission signal by a second number of second interleaved analog-to-digital converters of the second receiver, and wherein the first number of the first interleaved analog-to-digital converters is greater than or equal to the second number of the second interleaved analog-to-digital converters.

6. The method of claim 5, wherein the first number of the first interleaved analog-to-digital converters is greater than the second number of the second interleaved analog-to-digital converters.

7. The method of claim 5, wherein the first number of the first interleaved analog-to-digital converters is sixteen times greater than the second number of the second interleaved analog-to-digital converters.

8. The method of claim 5, wherein the first number of the first interleaved analog-to-digital converters is thirty-two times greater than the second number of the second interleaved analog-to-digital converters.

9. The method of claim 5, wherein the second number of the second interleaved analog-to-digital converters is one.

10. A circuit comprising:

a first receiver circuit comprising a first number of first interleaved analog-to-digital converters;

a data reordering circuit coupled to the first number of the first interleaved analog-to-digital converters;

a first equalizer coupled to the data reordering circuit;

a pulse amplitude modulation (PAM) eye diagram construction circuit coupled to the first equalizer; and an analysis circuit coupled to the PAM eye diagram construction circuit, wherein the analysis circuit is coupled to receive a pulse amplitude modulation (PAM) eye diagram and transmit eye information of the PAM eye diagram to a second receiver circuit to adjust a setting of a second equalizer of the second receiver circuit.

11. The circuit of claim 10, wherein the setting of the second equalizer is a tap setting.

12. The circuit of claim 10, further comprising a configurable circuit die comprising a configurable core fabric, wherein the configurable core fabric comprises the first receiver circuit, the data reordering circuit, the first equalizer, the PAM eye diagram construction circuit, and the analysis circuit.

13. The circuit of claim 12, wherein the second receiver circuit is external to the configurable circuit die.

14. The circuit of claim 13, wherein the second receiver circuit comprises a second number of second interleaved analog-to-digital converters, and the second number of the second interleaved analog-to-digital converters is greater than or equal to the first number of the first interleaved analog-to-digital converters.

15. The circuit of claim 10, wherein the second equalizer is coupled to the analysis circuit to perform equalization on the eye information prior to transmission of the eye information to the second receiver circuit.

16. The circuit of claim 10, wherein the first equalizer comprises at least one of a feed-forward equalizer and a decision-feedback equalizer.

17. The circuit of claim 10, wherein the second receiver circuit is a mission mode receiver.

18. The circuit of claim 10, further comprising a memory coupled between the first number of the first interleaved analog-to-digital converters and the data reordering circuit to store digitized samples of a transmission signal received and digitized by the first number of the first interleaved analog-to-digital converters.

19. A method comprising:

consecutively transmitting a transmission signal from a transmitter a plurality of times to provide transmission signals;

receiving each of the transmission signals by a first receiver and a second receiver;

consecutively digitizing each of the transmission signals by the first receiver at a first sampling frequency;

consecutively digitizing each of the transmission signals by the second receiver at a second sampling frequency that is less than or equal to the first sampling frequency;

generating a pulse amplitude modulation (PAM) eye diagram of the transmission signals using digitized signals digitized by the first and the second receivers from the transmission signals;

determining eye-opening information of at least one eye of the PAM eye diagram; and adjusting a first tap setting of a first equalizer of the first receiver using the eye-opening information determined from the at least one eye of the PAM eye diagram to compensate for transmission losses and noise of the transmission signals from the transmitter to the first and the second receivers.

20. The method of claim 19, further comprising adjusting a second tap setting of a second equalizer of the first receiver using the eye-opening information of the at least one eye of the PAM eye diagram, wherein the eye-opening information includes information for the transmission losses of the transmission signals.

* * * * *